(12) United States Patent
Fischereder et al.

(10) Patent No.: US 11,656,256 B2
(45) Date of Patent: May 23, 2023

(54) METHOD AND PHOTOVOLTAIC INVERTER FOR DETERMINING THE SYSTEM CAPACITY OF A PHOTOVOLTAIC SYSTEM TO GROUND

(71) Applicant: Fronius International GmbH, Pettenbach (AT)

(72) Inventors: Franz Fischereder, Pettenbach (AT); Andreas Luger, Pettenbach (AT); Christoph Pernegger, Pettenbach (AT); Juergen Pirchenfellner, Pettenbach (AT)

(73) Assignee: Fronius International GmbH, Pettenbach (AT)

( * ) Notice: Subject to any disclaimer, the term of this patent is extended or adjusted under 35 U.S.C. 154(b) by 0 days.

(21) Appl. No.: 17/640,913

(22) PCT Filed: Mar. 10, 2021

(86) PCT No.: PCT/EP2021/055970
§ 371 (c)(1),
(2) Date: Mar. 7, 2022

(87) PCT Pub. No.: WO2021/180754
PCT Pub. Date: Sep. 16, 2021

(65) Prior Publication Data
US 2022/0334159 A1    Oct. 20, 2022

(30) Foreign Application Priority Data
Mar. 11, 2020    (EP) .................................... 20162310

(51) Int. Cl.
*G01R 27/26* (2006.01)
*G01R 31/12* (2020.01)
(Continued)

(52) U.S. Cl.
CPC ......... *G01R 27/2605* (2013.01); *G01R 15/04* (2013.01); *G01R 31/12* (2013.01);
(Continued)

(58) Field of Classification Search
CPC ........ G01R 27/00; G01R 27/02; G01R 27/26; G01R 27/2605; G01R 15/00; G01R 15/04;
(Continued)

(56) References Cited

U.S. PATENT DOCUMENTS 9,720,025 B2 *   8/2017   Hermeling ............. G01R 31/52
9,869,710 B2 *   1/2018   Oberzaucher .......... G01R 31/12
(Continued)

FOREIGN PATENT DOCUMENTS

CN    102279318 A    12/2011
CN    103208937 A    7/2013
(Continued)

OTHER PUBLICATIONS

International Search Report in PCT/EP2021/055970, dated May 28, 2021.
(Continued)

*Primary Examiner* — Hoai-An D. Nguyen
(74) *Attorney, Agent, or Firm* — Collard & Roe, P.C.

(57) ABSTRACT

A method and a photovoltaic inverter determines the system capacitance of a photovoltaic system relative to ground. The voltage required for the measurement can be provided by the intermediate circuit in the form of the intermediate circuit voltage, and the measuring device is designed to actuate an input short-circuit switch for short-circuiting the DC input with the AC disconnector open, as a result of which the intermediate circuit voltage can be applied to the DC input in the reverse direction, and the measuring device is configured to determine the system capacitance from the tem-
(Continued)

Figure 1:
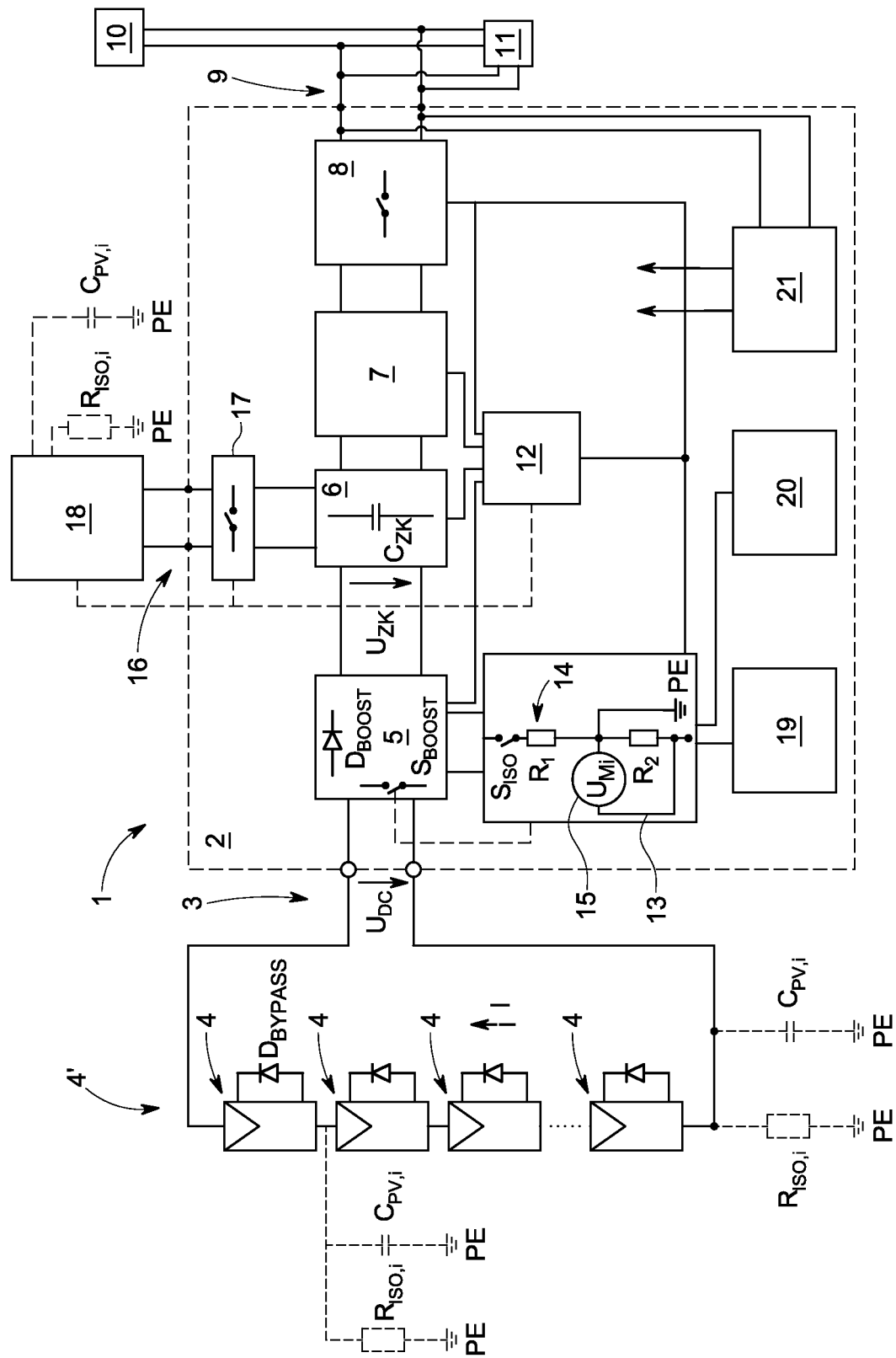

poral waveform of the measured voltage after the switch of the voltage divider is closed.

15 Claims, 9 Drawing Sheets

(51) Int. Cl.
    *G01R 15/04*     (2006.01)
    *H02S 40/32*     (2014.01)
    *H02S 40/38*     (2014.01)
    *H02J 7/35*     (2006.01)
    *H02J 3/38*     (2006.01)
    *H02M 3/04*     (2006.01)

(52) U.S. Cl.
    CPC ............... *H02J 3/381* (2013.01); *H02J 7/35* (2013.01); *H02M 3/04* (2013.01); *H02S 40/32* (2014.12); *H02S 40/38* (2014.12); *H02J 2207/20* (2020.01); *H02J 2300/24* (2020.01)

(58) Field of Classification Search
    CPC .. G01R 31/00; G01R 31/12; H02J 3/00; H02J 3/38; H02J 3/381; H02J 7/00; H02J 7/34; H02J 7/35; H02J 2207/00; H02J 2207/20; H02J 2300/00; H02J 2300/20; H02J 2300/22; H02J 2300/24; H02M 3/00; H02M 3/02; H02M 3/04; H02S 40/00; H02S 40/30; H02S 40/32; H02S 40/38
    USPC .......................................... 324/600, 649, 658
    See application file for complete search history.

(56) References Cited

U.S. PATENT DOCUMENTS

| | | |
|---|---|---|
| 11,221,356 B2 | 1/2022 | Putz |
| 2018/0233919 A1* | 8/2018 | Gu .......................... H02S 40/32 |
| 2020/0300924 A1 | 9/2020 | Viotto et al. |

FOREIGN PATENT DOCUMENTS

| | | |
|---|---|---|
| CN | 110574287 A | 12/2019 |
| DE | 10 2013 227 174 A1 | 7/2015 |
| DE | 10 2015 114 916 A1 | 3/2017 |
| DE | 10 2017 129 083 A1 | 6/2019 |
| EP | 1 291 997 A2 | 3/2003 |
| EP | 2 648 009 A1 | 10/2013 |

OTHER PUBLICATIONS

European Search Report in EP 20162310.5-1010, dated Sep. 7, 2020, with English translation of relevant parts.
Chinese Office Action in Chinese Patent Application No. 202180005773.7 dated Jan. 18, 2023 with English translation.

\* cited by examiner

METHOD AND PHOTOVOLTAIC INVERTER FOR DETERMINING THE SYSTEM CAPACITY OF A PHOTOVOLTAIC SYSTEM TO GROUND

CROSS REFERENCE TO RELATED APPLICATIONS

This application is the National Stage of PCT/EP2021/055970 filed on Mar. 10, 2021, which claims priority under 35 U.S.C. § 119 of European Application No. 20162310.5 filed on Mar. 11, 2020, the disclosure of which is incorporated by reference. The international application under PCT article 21(2) was not published in English.

The invention relates to a method for determining the system capacitance of a photovoltaic system relative to ground, having a photovoltaic inverter with at least one DC input for connecting to at least one photovoltaic module or a string of a plurality of photovoltaic modules, a DC/DC converter with an input diode, an intermediate circuit, a DC/AC converter, an AC disconnector, an AC output for connection to a supply network and/or consumer, a control device, and with a measuring device with a voltage divider containing at least two resistors, a switch for connecting a resistor of the voltage divider and a voltage measuring unit for recording measured voltages on at least one resistor of the voltage divider with the switch of the voltage divider open and closed, and for determining the system capacitance from the temporal waveform of the measured voltages.

Furthermore, the invention relates to a photovoltaic inverter for determining the system capacitance of a photovoltaic system, having at least one DC input for connecting to at least one photovoltaic module or a string of a plurality of photovoltaic modules, a DC/DC converter with an input diode, an intermediate circuit, a DC/AC converter, an AC disconnector, an AC output for connection to a supply network and/or consumer, a control device, and with a measuring device with a voltage divider containing at least two resistors, a switch for connecting a resistor of the voltage divider, and a voltage measuring unit for recording measured voltages on at least one resistor of the voltage divider with the switch of the voltage divider open and closed, and for determining the system capacitance from the temporal waveform of the measured voltages.

A photovoltaic system usually has a certain capacitance, the so-called system capacitance, relative to ground. Usually, the system capacitance is relatively small, resulting in relatively low capacitive leakage currents. A number of factors, in particular damp weather or water, influence the system capacitance in addition to the assembly type of the photovoltaic modules and possible insulation faults in components of the photovoltaic system. If the system capacitance increases, the capacitive leakage currents also increase. If the photovoltaic inverter is connected to the supply network and/or consumers, in the event of higher system capacitances the higher capacitive leakage currents can cause the system fuses to trip. For example, various countries require residual current circuit breakers (RCCBs), which trigger at currents as low as 30 mA to protect the photovoltaic systems. After the RCCB has been triggered, it must be switched on again manually. Until this happens, a long time can elapse during which no electrical energy is fed into the supply network or no electrical energy is supplied to consumers. As a result, the yield of the photovoltaic system decreases, along with any potential profit for the user of the photovoltaic system.

In the prior art, methods and devices for compensating such leakage currents have become known that are able to prevent the tripping of residual current circuit breakers in the event of inadmissibly high system capacitances. However, such compensation methods are relatively complex and are usually limited to small photovoltaic systems only.

DE 10 2013 227 174 A1 describes a device and a method for determining the insulation resistance of a photovoltaic system. No determination of the system capacitance relative to ground or of the leakage currents is provided.

For example, DE 10 2017 129 083 A1 describes a method in which the system capacitance is determined and compared with a predefined limit value in order to prevent unnecessary tripping of a residual current circuit breaker before the power generation system is connected. The power generation system is only connected to the supply network if the system capacitance is less than the specified limit value. The disadvantage of this is that only the system capacitance of the generator of the power generation system is determined and a connection to the supply network is established via the neutral conductor during the measurement.

EP 1 291 997 A2 describes a photovoltaic system in which the photovoltaic modules are equipped with a residual current detector which has a lower tripping threshold than the residual current circuit breaker of the photovoltaic system. If the additional residual current detector detects an inadmissibly high current value, the photovoltaic inverter will not be connected to the supply network.

Modern photovoltaic systems, so-called hybrid photovoltaic systems, often have energy storage systems which can be used to store electrical energy temporarily so that it can be fed into the supply network or used to supply the consumers even at times when no voltage is generated by the photovoltaic modules. This means that it is desirable or necessary to connect the photovoltaic inverter to the supply network or the consumers during the night hours as well. Before switching on the connection or closing the AC disconnector, however, it is advisable to determine the system capacitance. However, many well-known methods do not allow measurement of the system capacitance of the photovoltaic system during the night, as in the absence of solar radiation the photovoltaic modules are particularly highly resistive, and with conventional methods it is not possible to reliably measure the system capacitance at night. In addition, such energy storage devices connected to the inverter are often ignored when checking the system capacitance, although they can influence the measurement result.

Modern photovoltaic modules have an integrated set of electronics, known as MLPE (Module-Level Power Electronics), which can be used to optimize the performance of the photovoltaic modules. Such circuits usually also include switches that can be used to disable individual modules, for example, if they are in shade. For safety reasons, for example, it may be necessary to perform a shutdown ("rapid shutdown") of the photovoltaic modules equipped with such an electronics, to ensure that no dangerous DC voltages are present on the supply lines to the photovoltaic inverter. In this case, it would also be impossible to accurately measure the system capacitance using conventional measuring methods.

The object of the present invention is to create an above-mentioned method and an above-mentioned photovoltaic inverter for determining the system capacitance of a photovoltaic system relative to ground, which enables a fast and simple determination in order to prevent an unintended tripping of a residual current circuit breaker if the system capacitance exceeds an inadmissibly high value. The entire system capacitance of the photovoltaic system, i.e. all possible capacitances between the photovoltaic modules and ground but also between all possible energy storage devices and ground, should be determined and taken into account. Disadvantages of known methods and devices should be avoided or at least reduced.

The object is achieved with respect to the method by providing the voltage required for the measurement by the intermediate circuit in the form of the intermediate circuit voltage, and recording the measured voltages with the AC disconnector open while the DC input is short-circuited with an input short-circuit switch, which applies the intermediate circuit voltage to the DC input in the reverse direction, and determining the system capacitance from the temporal waveform of the measured voltage after the switch of the voltage divider is closed. Short-circuiting the DC input of the photovoltaic inverter creates an electrical circuit in which current from the intermediate circuit flows through the photovoltaic modules in the direction of the bypass diodes connected in parallel with the photovoltaic modules. This means that an accurate measurement of the system capacitance is possible, in particular during the night when the photovoltaic modules are particularly highly resistive, or when the photovoltaic modules are not generating voltage for other reasons. With the aid of the voltage measuring unit, the measured voltages are recorded with the switch open and closed and the system capacitance is determined from the temporal waveform of the measured voltage after the switch of the voltage divider is closed.

This is achieved via the time constant of the temporal waveform of the measured voltage and knowledge of the values of the resistances of the voltage divider. The voltage required for the measurement is provided in the form of the intermediate circuit voltage from the intermediate circuit of the photovoltaic inverter. The intermediate circuit is supplied with electrical energy either from a power supply, the DC input, or an energy storage device. The method is also suitable for use in photovoltaic modules with integrated electronics, so-called MLPE (Module-Level Power Electronics), in which a reliable measurement of the system capacitance has not previously been possible. The AC disconnector is open during the determination of the system capacitance, i.e. the photovoltaic inverter is completely disconnected from the supply network or from consumers. Of course, the system capacitance can also be measured using this method during the day when the photovoltaic modules are supplying a voltage. However, in this case, the input short-circuit switch is more heavily loaded by the higher current, which means that the system capacitance can also be determined using conventional methods. Single-fault safety is required when determining the system capacitance, as even the failure of one component of the components relevant to the measurement (input short-circuit switch, resistors of the voltage divider, switches for connecting a resistor of the voltage divider) makes measurement impossible and therefore no fault measurement is possible.

According to another feature, the AC disconnector of the photovoltaic inverter is only closed if a defined maximum system capacitance is not exceeded. This can prevent accidental triggering of a residual current circuit breaker in the event of an inadmissibly high system capacitance of the photovoltaic system and reduce times during which no energy is generated by the photovoltaic system.

The measured system capacitance can also be used to determine the switching state of a DC disconnector that is normally present at the input of the photovoltaic inverter. This is possible because certain capacitances of the photovoltaic inverter relative to ground are also part of the total system capacitance. For example, the DC disconnector is opened during maintenance work on the photovoltaic inverter, so that no dangerous DC voltage from the photovoltaic modules is present at the input of the photovoltaic inverter. The AC disconnector of the photovoltaic inverter is preferably only activated and closed when the DC disconnector is closed and the inverter is thus connected to the supply network and/or the consumers. If the measured system capacitance falls below a defined minimum system capacitance, this is an indication that the DC disconnector is open and that the photovoltaic modules are therefore not connected to the input of the photovoltaic inverter. Thus, the comparison of the measured system capacitance with such a defined minimum system capacitance can be used as a condition for connecting the photovoltaic inverter to the supply network and/or the consumers.

If the DC input is short-circuited via an existing boost switch of the DC/DC converter, implemented as a booster, of the photovoltaic inverter acting as an input short-circuit switch, an existing boost switch can be used for the accurate and reliable determination of the system capacitance without the need for dedicated hardware.

According to another feature of the invention, the voltage at the DC input of the photovoltaic inverter can be measured, and if the voltage falls below a preset limit value the DC input can be short-circuited with the input short-circuit switch. This ensures that during the night or when the photovoltaic modules are supplying no voltage or too low a voltage for other reasons, for example, the activation of electronics integrated in the photovoltaic modules, it is still possible to record the measured values accurately and thus determine the system capacitance by applying the intermediate circuit voltage to the photovoltaic modules in the reverse direction.

Preferably, in addition to the system capacitance, the insulation resistance of the photovoltaic system to ground is also determined from the measured values of the two measured voltages with the switch of the voltage divider open and closed. In this way, the connection of the photovoltaic inverter to the supply network and/or to consumers can be made dependent not only on the size of the system capacitance, but also on the measured insulation resistance. In many cases, the measurement of the insulation resistance is mandatory under applicable regulations before the photovoltaic inverter can be connected, or at least once per day. With the aid of the voltage measuring unit, the measured voltages are recorded when the switch is open and closed and the insulation resistance is determined from this. This is achieved by means of the values of the two measured voltages, knowing the values of the resistors of the voltage divider. The method is also suitable for use in photovoltaic modules with integrated electronics, so-called MLPE (Module-Level Power Electronics), in which a reliable measurement of the insulation resistance has not previously been possible. The AC disconnector is open during the determination of the insulation resistance, i.e. the photovoltaic inverter is completely disconnected from the supply network or from consumers. Of course, the insulation resistance can also be measured using this method during the day, when the photovoltaic modules are supplying a voltage. However, in this case, the input short-circuit switch is loaded more heavily by the higher current, which means the insulation resistance can also be determined using conventional methods. Single-fault safety is required when determining the insulation resistance using this method, as even the failure of one component of the components relevant to the measurement (input short-circuit switch, resistors of the voltage divider, switches for connecting a resistor of the voltage divider) makes measurement impossible and therefore no fault measurement is possible.

On the one hand, it is possible to determine only whether a defined minimum insulation resistance is exceeded, and then only close the AC disconnector of the photovoltaic inverter if this defined minimum insulation resistance is exceeded. In this case, the relative insulation resistance is determined by detecting only whether the defined minimum insulation resistance is not reached, but not the absolute value. The determination of the relative insulation resistance can be performed more quickly since it is not necessary to allow transient processes to decay to obtain stable measured values.

On the other hand, the absolute insulation resistance can be determined as well as detecting whether a defined minimum insulation resistance has been exceeded, by recording the measured voltages during a specified time interval, in particular 1 s to 10 s. The measurement of the absolute values for the insulation resistance requires waiting for the decay of various transient processes within the specified time interval. In the case of conventional power classes of photovoltaic systems in the range of a few kW, time intervals in the range between 1 s and 10 s have proved to be suitable. Accordingly, the absolute insulation resistance measurement takes longer than the relative insulation resistance measurement. The photovoltaic inverter can then be connected to the power supply network and/or consumers.

If, as in so-called hybrid inverters, an energy storage device is provided, this energy storage device can be connected by closing a battery disconnector, and the measured voltages can be recorded and the system capacitance and, if applicable, the insulation resistance determined from these. By ensuring that the energy storage device is connected during the determination of the system capacitance and, if applicable, the insulation resistance, the contribution of the energy storage device to the overall system capacitance and, if applicable, the insulation resistance can also be reliably measured.

The falling below of the defined maximum system capacitance, the absolute system capacitance, the exceeding of the defined minimum insulation resistance and/or the absolute insulation resistance can be determined with and without the energy storage system connected. Ideally, the system capacitance and the insulation resistance are measured both with the energy storage device connected and with the energy storage system disconnected. This allows the contribution of the energy storage device to the system capacitance and the insulation resistance to be measured separately and a fault in the photovoltaic system can then be better isolated or located more quickly.

Preferably, the falling below of the defined maximum system capacitance, the absolute system capacitance, the exceeding of the defined minimum insulation resistance and/or the absolute insulation resistance is determined during the night. As already mentioned above, in modern hybrid inverters, for example, it may also be useful or necessary to connect them to the supply network or the consumers during the night in order to be able to feed energy from the energy storage device into the supply network, for example.

Preferably, the falling below of the defined maximum system capacitance, the absolute system capacitance, the exceeding of the defined minimum insulation resistance and/or the absolute insulation resistance is determined at least once per day, in particular before each connection of the photovoltaic inverter to the supply network and/or consumers by closing the AC disconnector.

The measured voltages are advantageously averaged over a defined time interval. For example, the sampling frequency of the measured values is 10 kHz and the arithmetic mean is formed from blocks of 10 measured values. The averaging results in a smoothing of the measured values and thus more reliable measured values are obtained.

The falling below of the defined maximum system capacitance, the absolute system capacitance, the exceeding of the defined minimum insulation resistance and/or the absolute insulation resistance can be displayed and/or stored. Displaying and/or storing the measured values can be used for documentation purposes or for monitoring purposes. Of course, the values can also be queried remotely if required, as is usual with other measurement data of modern photovoltaic systems.

The falling below of the defined maximum system capacitance, the absolute system capacitance, the exceeding of the defined minimum insulation resistance, and/or the absolute insulation resistance are advantageously determined within a measuring time of a maximum of 10 s. Such short measuring times have proved possible in photovoltaic systems with common power ranges of a few kW. Due to such short measuring times, despite frequent measurements of the system capacitance and, if applicable, the insulation resistance, valuable time for feeding energy into the supply network and/or supplying consumers with electrical energy hardly ever needs to be wasted. As a result, such photovoltaic systems are characterized by particularly high yields.

The object according to the invention is also achieved by a photovoltaic inverter as mentioned above, wherein the voltage required for the measurement can be provided by the intermediate circuit in the form of the intermediate circuit voltage, and the measuring device is designed to actuate an input short-circuit switch for short-circuiting the DC input with the AC disconnector open, which allows the intermediate circuit voltage to be applied to the DC input in the reverse direction, and the measuring device is configured to determine the system capacitance from the temporal waveform of the measured voltage after the switch of the voltage divider is closed. The photovoltaic inverter enables the exact determination of the system capacitance with the AC disconnector fully open, in particular even during the night, when the photovoltaic modules do not supply voltage or the electronics of the photovoltaic modules is activated. The hardware outlay is particularly low, the necessary programming of the measuring procedure can also be carried out in an already existing control unit of the photovoltaic inverter. For further advantages that can be achieved with the photovoltaic inverter according to the invention, reference is made to the above description of the method for determining the system capacitance.

The measuring device is preferably connected to the AC disconnector or the control device, so that the AC disconnector can only be closed if a defined maximum system capacitance is not exceeded. This prevents the photovoltaic inverter from being connected to the supply network and/or to consumers under conditions of inadmissibly high system capacitance and thus prevents the tripping of a residual current circuit breaker.

According to another feature of the invention, at least one battery terminal connected to the intermediate circuit with at least one battery disconnector is provided for connection to at least one energy storage device, wherein the battery disconnector is connected to the measuring device or the control device, so that the battery disconnector can be actuated during the recording of the measuring voltages. This ensures that a leakage current of the energy storage device is taken into account when measuring the total system capacitance and, if applicable, the insulation resistance.

If the input short-circuit switch is formed by an existing boost switch of the DC/DC converter implemented as a booster, the hardware outlay can be reduced.

The measuring device can be designed to measure the input voltage at the DC input of the photovoltaic inverter, so that if the measured voltage is below a specified limit value, the input short-circuit switch can be closed. This ensures that the intermediate circuit voltage is applied to the photovoltaic modules or the string of photovoltaic modules in the reverse direction, thus ensuring accurate measurement of the system capacitance and, if applicable, the insulation resistance even during the night or if the photovoltaic module is not supplying a voltage or supplying too low a voltage for other reasons.

It is also advantageous if the measuring device is also designed to determine the insulation resistance from the measured voltages recorded with the switch of the voltage divider open and closed. As already mentioned above, as a result the connection of the photovoltaic inverter to the supply network and/or to the consumers can be made dependent not only on the size of the system capacitance, but also on the measured insulation resistance.

The measuring device can be designed to determine the relative insulation resistance and/or the absolute insulation resistance, wherein the measurement of the absolute insulation resistance requires more time since transient processes have to be allowed to settle.

In particular, the measuring device is designed to determine the system capacitance and, if applicable, the insulation resistance when photovoltaic modules with integrated electronics (so-called MLPE Module-Level Power Electronics) are connected to the DC input. This means, for example, that a reliable determination of the system capacitance and, if applicable, the insulation resistance can also be carried out for photovoltaic modules with "rapid shutdown" activated. For safety reasons, for example, it may be necessary to perform a shutdown of photovoltaic modules equipped with such electronics, to ensure that no dangerous DC voltages are present on the supply lines to the photovoltaic inverter.

Advantageously, a display and/or a memory is provided for displaying and storing respectively the falling below of the defined maximum system capacitance, the absolute system capacitance, the exceeding of the defined minimum insulation resistance and/or the absolute insulation resistance.

Figure 2:
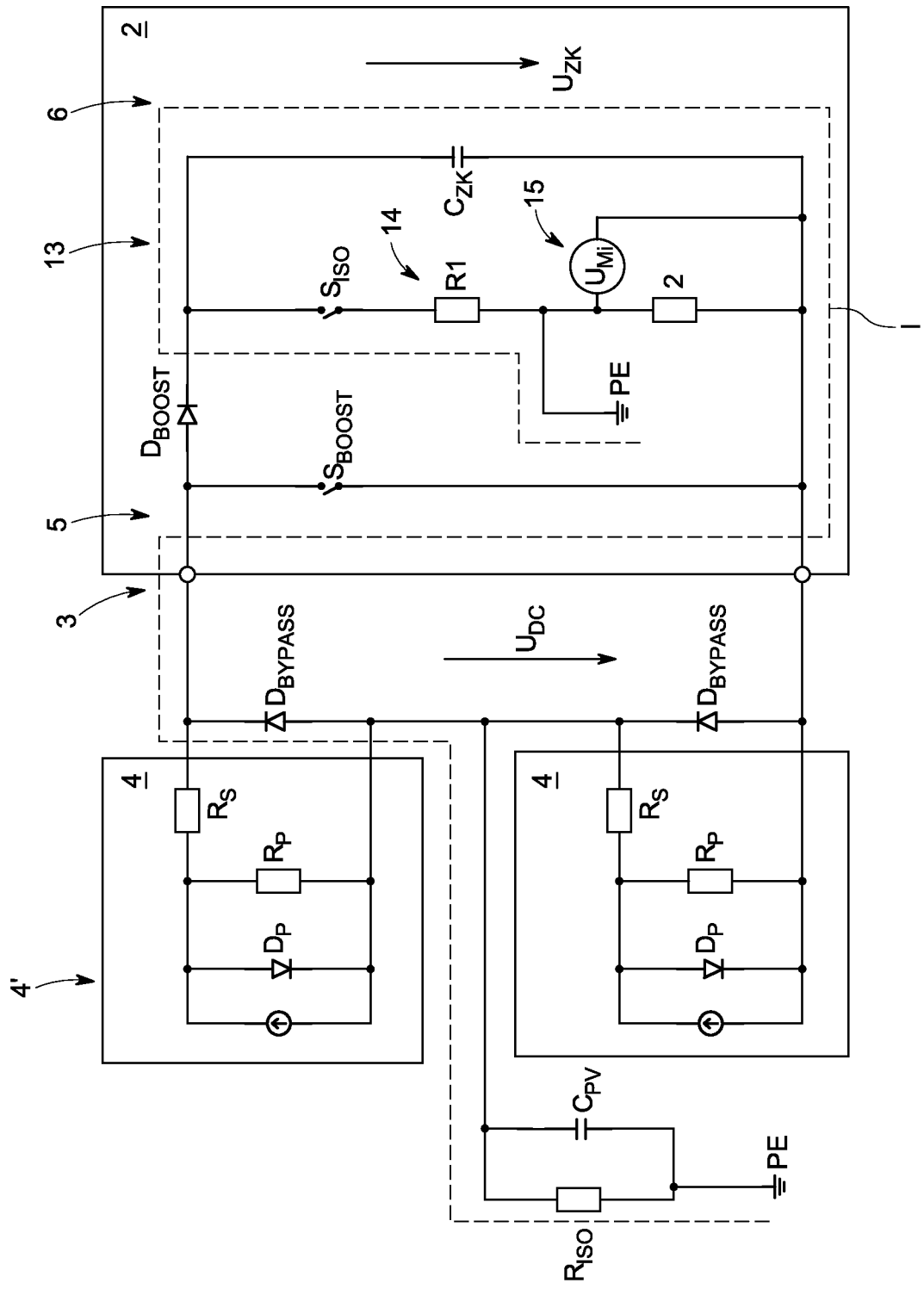
Figure 3:
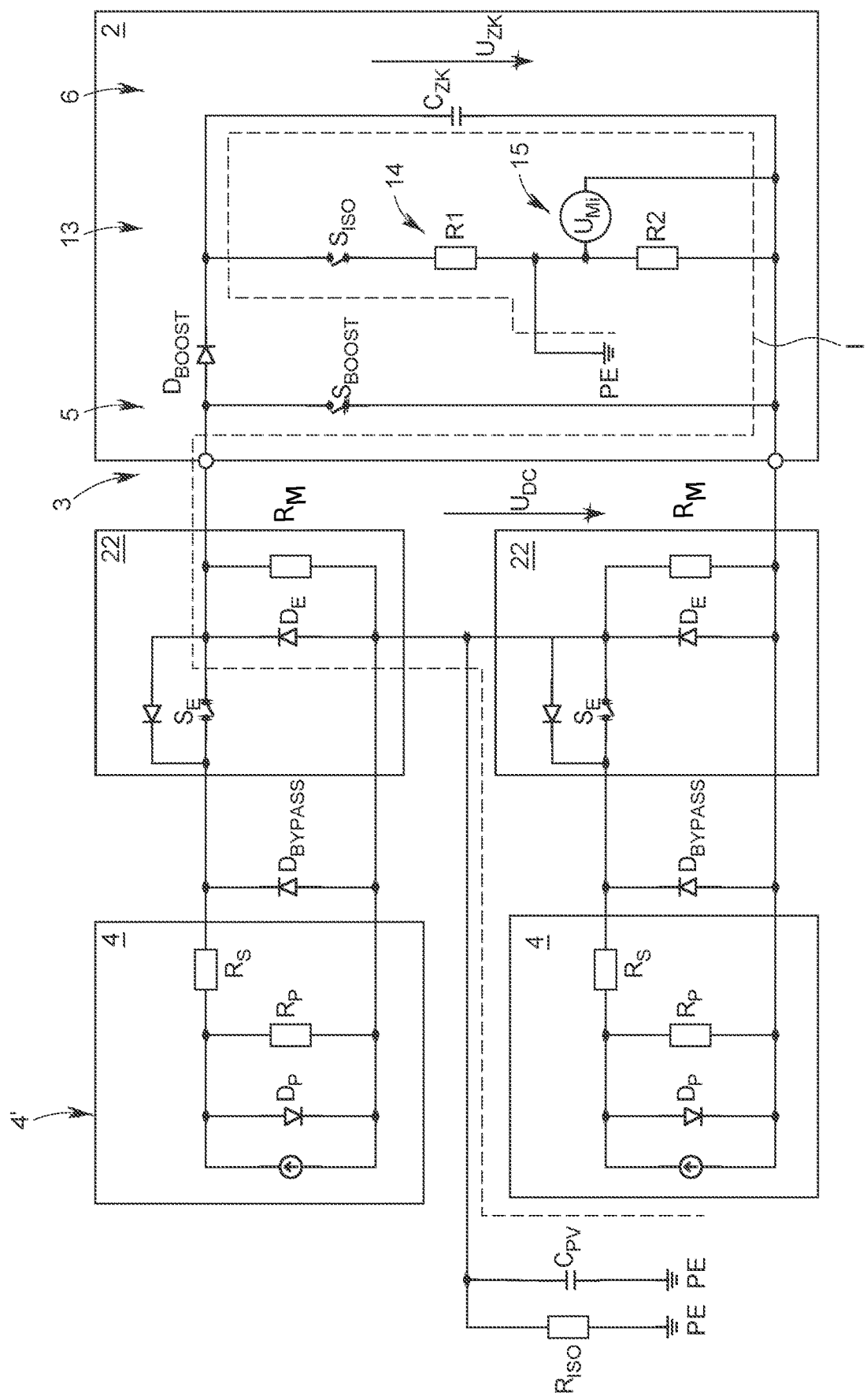
Figure 4:
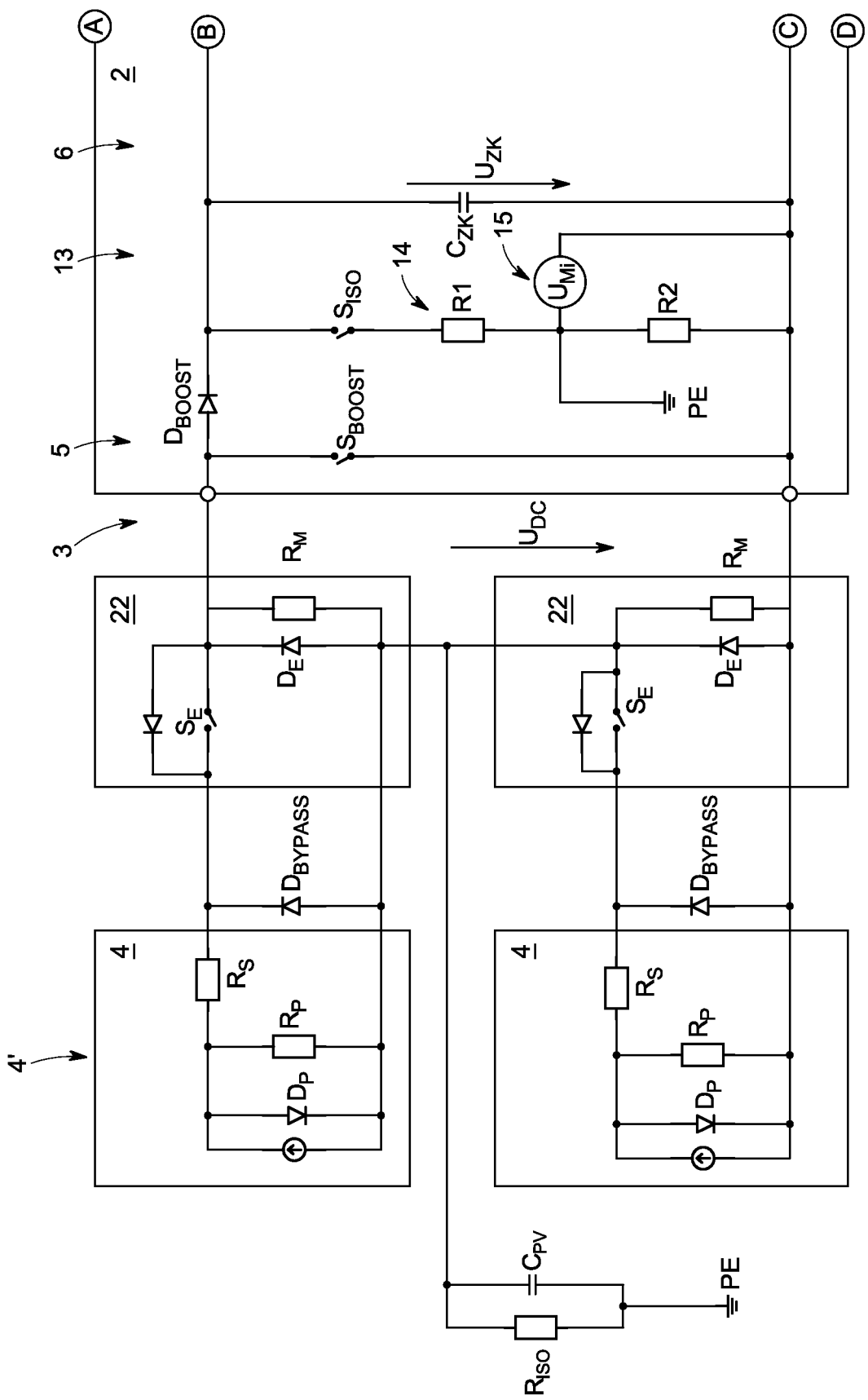
Figure 4:
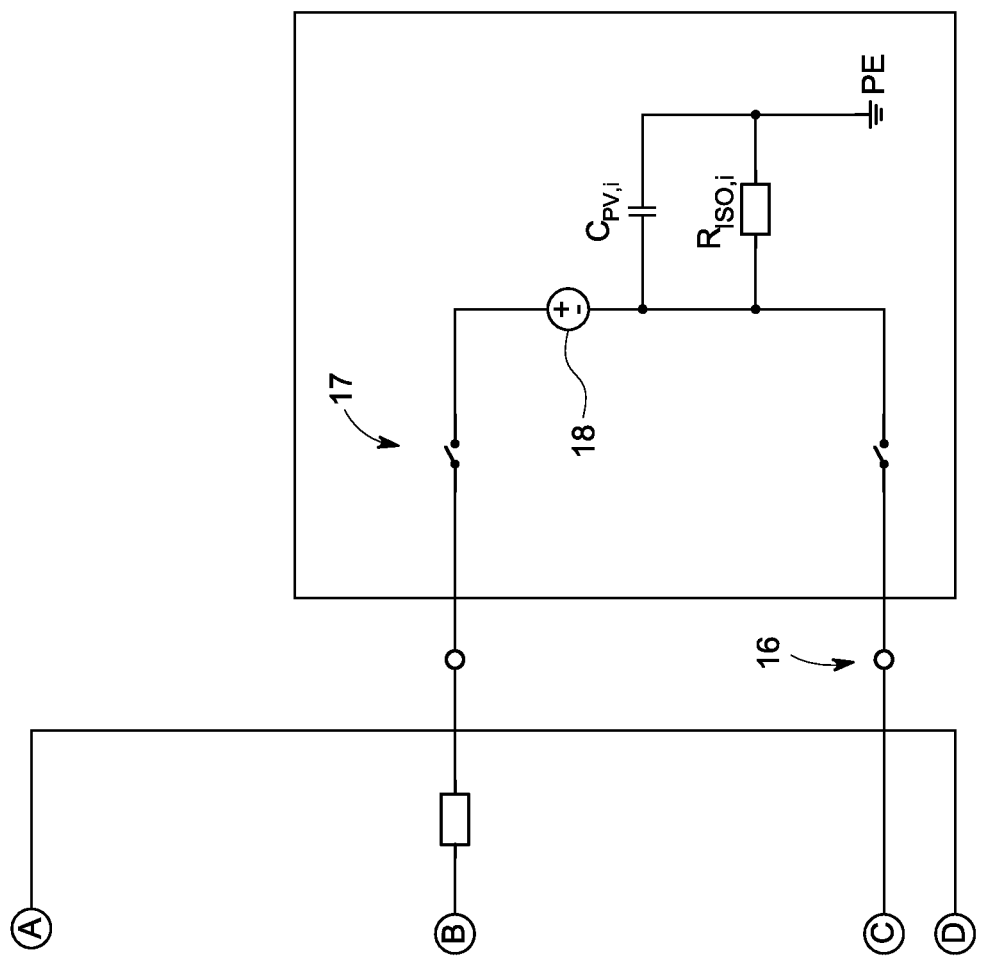
Figure 5:
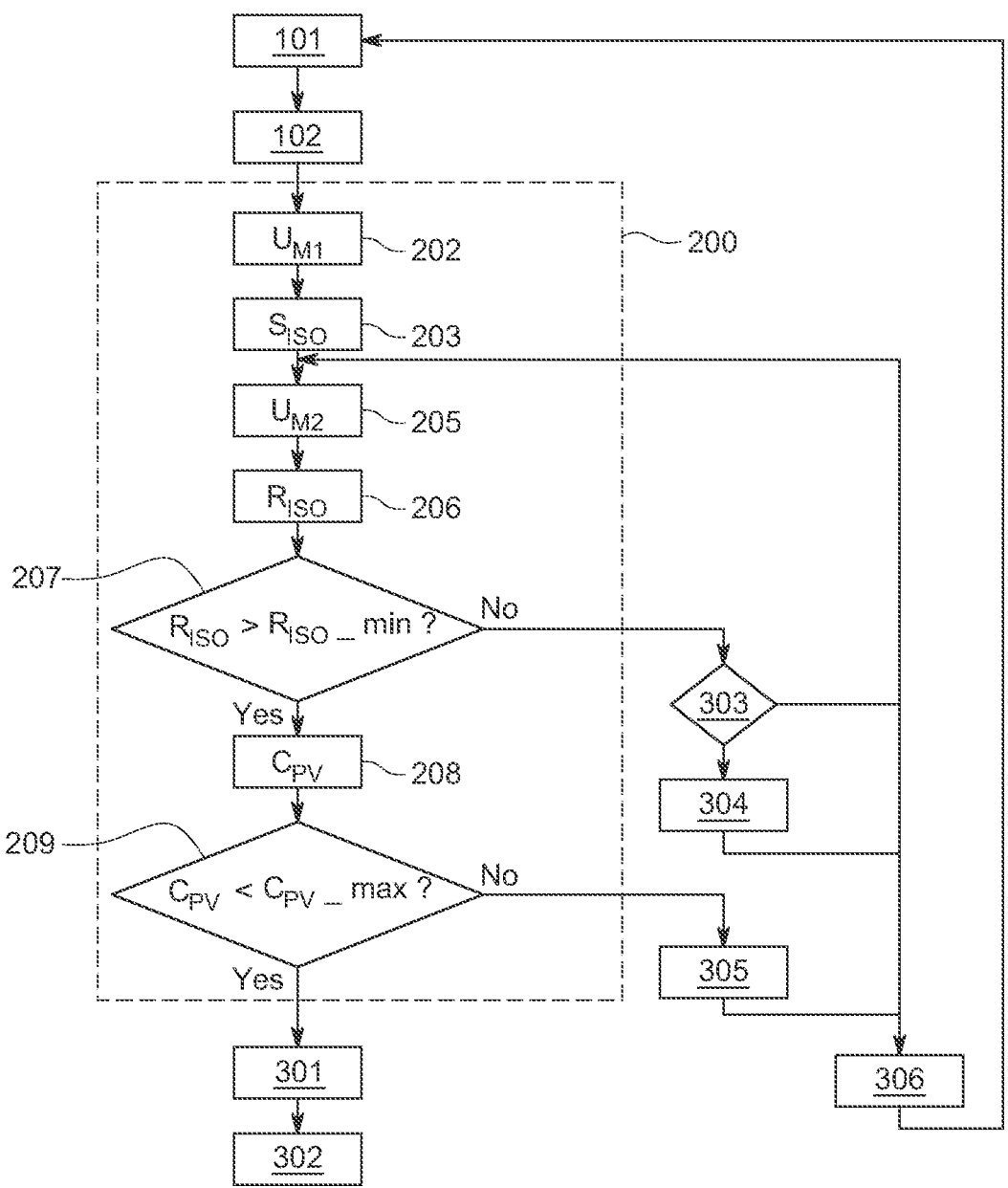
Figure 6:
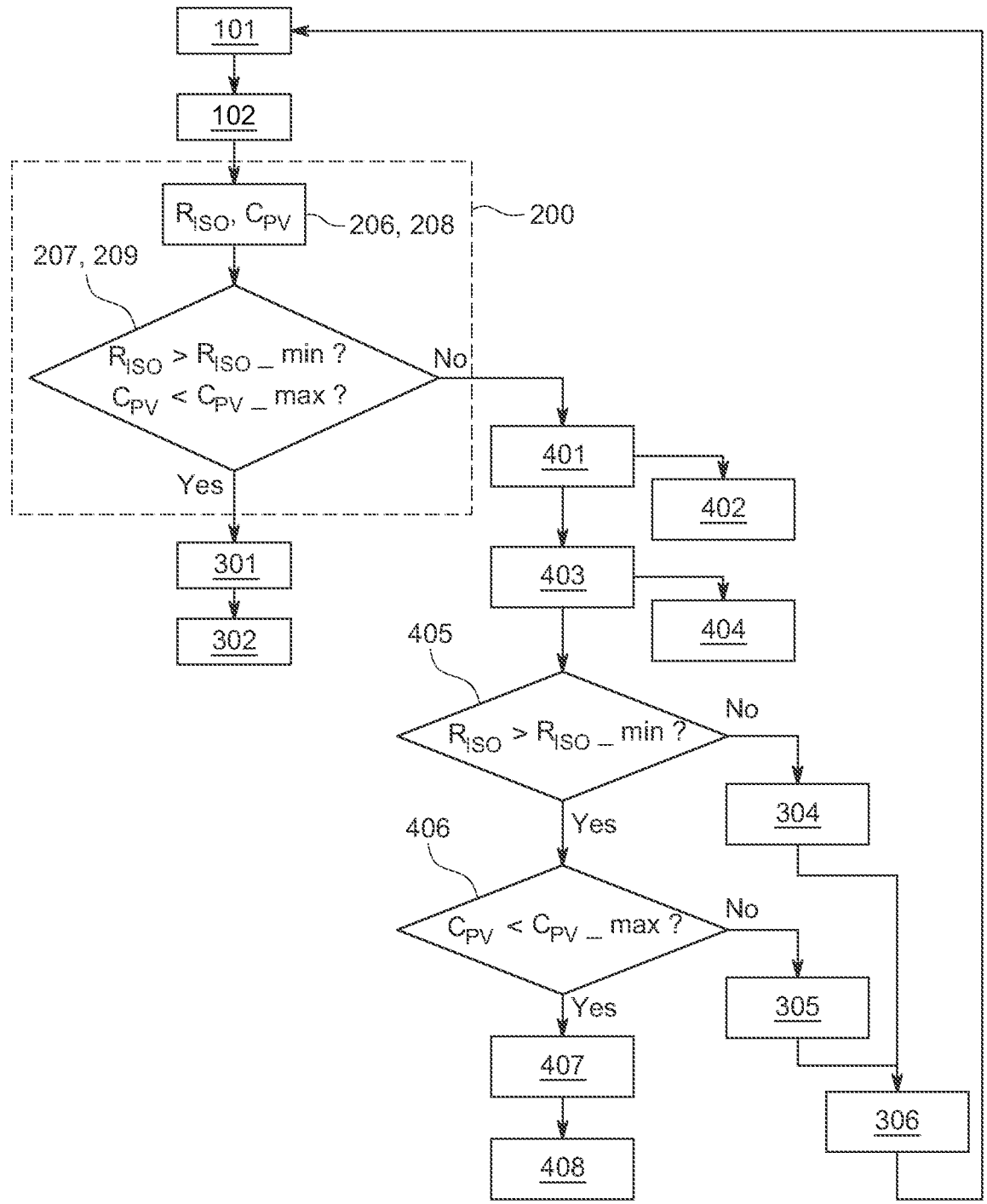
Figure 7:
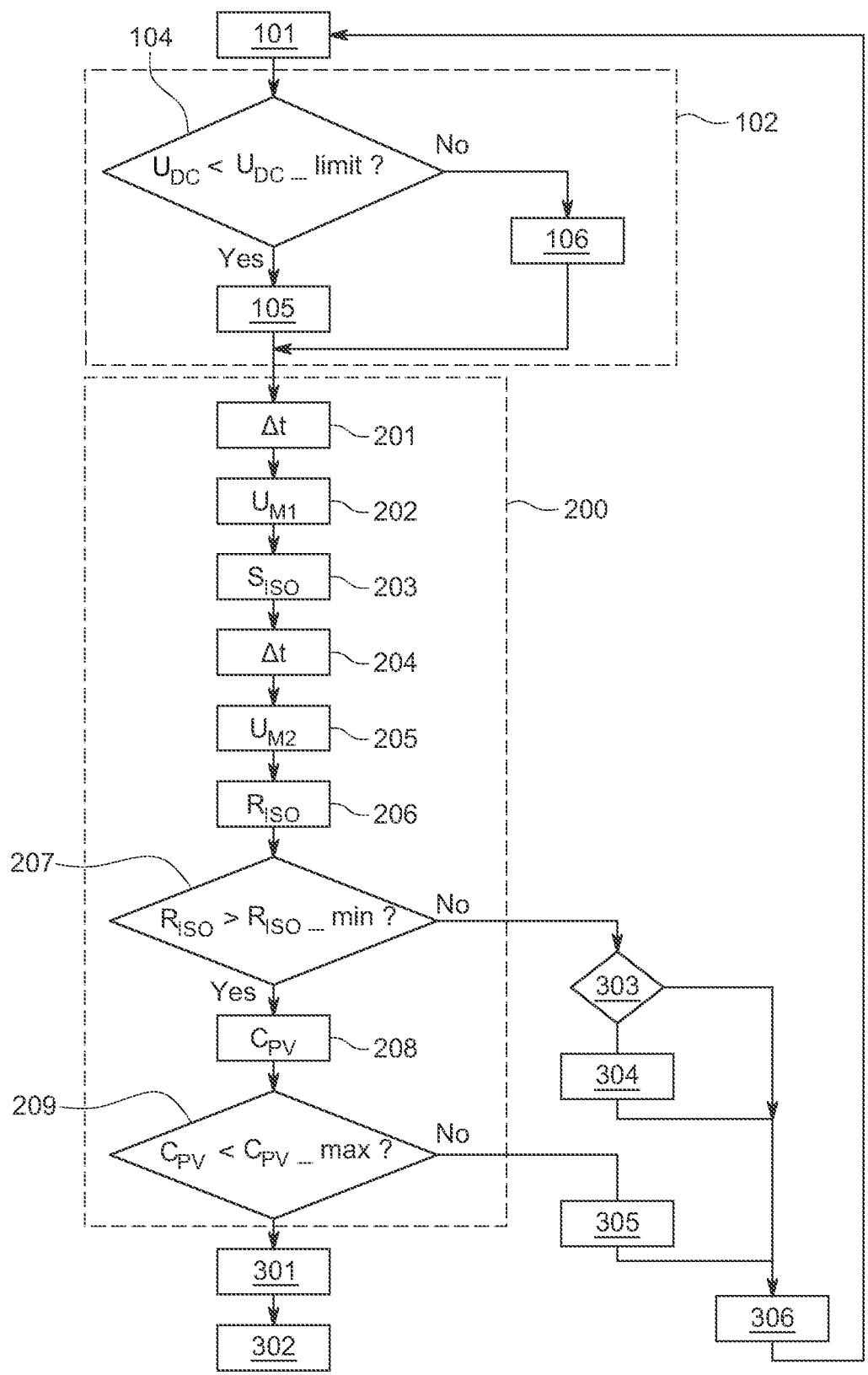
Figure 8:
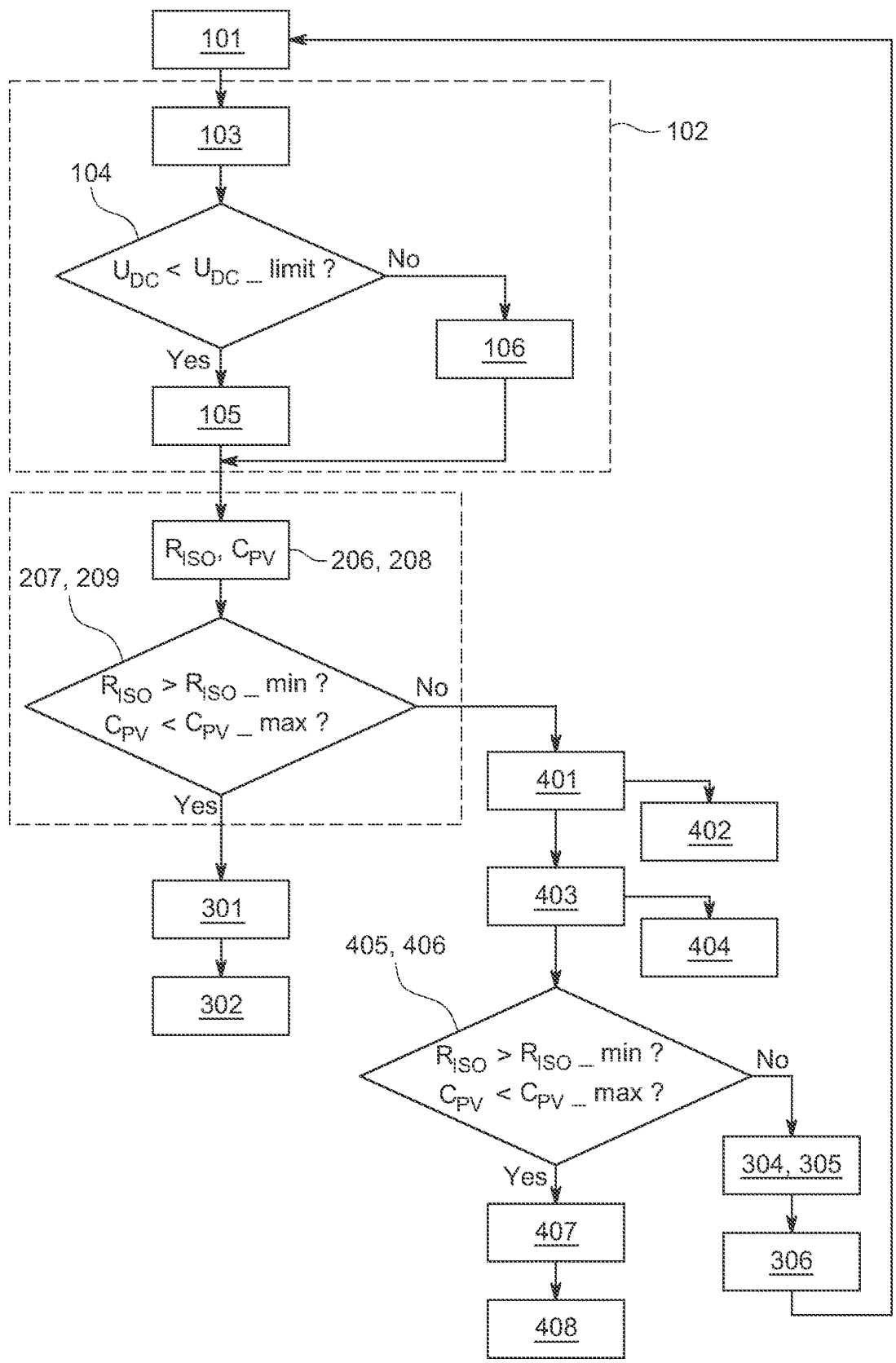

The present invention will be explained in further detail by reference to the attached drawings. Shown are:

FIG. 1 a block diagram of a photovoltaic inverter designed according to the invention for determining the system capacitance relative to ground;

FIG. 2 a simplified circuit diagram of a photovoltaic inverter designed according to the invention with photovoltaic modules connected thereto;

FIG. 3 a simplified circuit diagram of a photovoltaic inverter designed according to the invention with photovoltaic modules connected thereto having integrated electronics;

FIG. 4 a simplified circuit diagram of a photovoltaic inverter designed according to the invention with photovoltaic modules connected thereto having integrated electronics and a connected energy storage device;

FIG. 5 a flowchart illustrating the determination of the relative system capacitance and the relative insulation resistance;

FIG. 6 a flowchart illustrating the determination of the relative system capacitance and the relative insulation resistance of a hybrid inverter with connected energy storage device;

FIG. 7 a flowchart illustrating the determination of the absolute system capacitance and the absolute insulation resistance; and FIG. 8 a flowchart illustrating the determination of the absolute system capacitance and the absolute insulation resistance of a hybrid inverter with connected energy storage device.

FIG. 1 shows a block diagram of a transformer-less photovoltaic inverter 2 of a photovoltaic system 1 designed according to the invention for determining the system capacitance $C_{PV}$ relative to ground PE. The photovoltaic inverter 2 contains at least one DC input 3 for connection to at least one photovoltaic module 4 or a string 4' of a plurality of photovoltaic modules 4. The photovoltaic modules 4 have a bypass diode $D_{Bypass}$ to enable a current flow if one of the photovoltaic modules 4 of a string 4' is in shade. A DC/DC converter 5, which is often designed as a booster or an up-converter or a step-up converter, is arranged behind the DC input 3 of the photovoltaic inverter 2. An input diode (also a boost diode) $D_{boost}$ is arranged in the DC/DC converter 5. This is followed by the intermediate circuit 6, a DC/AC converter 7, an AC disconnector 8 and an AC output 9 for connection to a power supply network 10 and/or consumers 11. The various components of the photovoltaic inverter 2 are controlled or regulated via a control unit 12. In order to be independent of the supply grid 10 even at night, when the photovoltaic modules 4 do not supply any voltage, suitable energy storage devices 18 are often connected to the photovoltaic inverter 2 via a battery connection 16. The energy storage devices 18 are connected to the photovoltaic inverter 2 via a battery disconnector 17, in order to be able to disconnect them from the photovoltaic inverter 2 also. The battery disconnector 17, which can also be integrated in the energy storage device 18, and the energy storage device 18 are usually connected to the control unit 12, which is represented by the dashed line. A power supply 21 supplies the components of the photovoltaic inverter 2 with electrical energy.

The photovoltaic system 1 has a certain system capacitance $C_{PV}$ relative to ground PE, which is composed of individual capacitances $C_{PV,i}$ relative to ground PE. In the equivalent circuit diagram, the total system capacitance $C_{PV}$ can be represented by a parallel connection of various system capacitances $C_{PV,i}$. For example, certain capacitances $C_{PV,i}$ exist between the photovoltaic modules 4 and ground PE, as well as between any energy storage devices 18 and ground PE, which add up to the total system capacitance $C_{PV}$. To prevent the residual current circuit breaker (not shown), which is intended to protect the photovoltaic system 1, from being triggered when the photovoltaic inverter 2 is connected to the supply grid 10 or consumers 11 with an inadmissibly high system capacitance value $C_{PV}$ present, it is important to regularly determine the system capacitance $C_{PV}$ of the entire photovoltaic system 1. For this purpose a measurement of the relative system capacitance $C_{PV}$, i.e. determining whether the value is below the defined maximum system capacitance $C_{PV,max}$, can be sufficient or else the absolute system capacitance $C_{PV}$ can be determined.

The photovoltaic system 1 also has a certain insulation resistance $R_{iso}$ relative to ground PE, which is also composed of individual partial insulation resistances $R_{iso,i}$ relative to ground PE. In the equivalent circuit diagram, the total insulation resistance $R_{iso}$ can be represented by a parallel connection of various partial insulation resistances $R_{iso,i}$. For example, certain partial insulation resistances $R_{iso,i}$ exist between the photovoltaic modules 4 and ground PE, as well as between any energy storage devices 18 and ground PE, which add up to the total insulation resistance $R_{iso}$. In order to prevent danger to persons or also the risk of destroying components of the photovoltaic system 1, regular determination of the actual insulation resistance $R_{iso}$ of the entire photovoltaic system 1 is important, often even mandatory. Either a measurement of the relative insulation resistance $R_{iso}$, i.e. the exceeding of a defined minimum insulation resistance $R_{iso\_min}$, or the absolute insulation resistance $R_{iso}$ can be determined.

In most cases, both the system capacitance $C_{PV}$ and the insulation resistance $R_{iso}$ are determined simultaneously or in direct succession.

For this purpose, a measuring device 13 is provided, which contains a voltage divider 14 comprising at least two resistors $R_1$, $R_2$ and a switch $S_{iso}$ for connecting a resistor $R_1$ of the voltage divider 14. Using a voltage measuring unit 15, measured voltages $U_{Mi}$ are recorded on at least one resistor $R_2$ of the voltage divider 14. A first measured value of the measured voltage $U_{M1}$ is determined when the switch $S_{iso}$ is open and a second measured value of the measured voltage $U_{M2}$ is determined when the switch $S_{iso}$ is closed. The system capacitance $C_{PV}$ can be determined from the temporal waveform of the measured voltage $U_{M2}$ after the switch $S_{iso}$ is closed. This is achieved via the time constant of the temporal waveform of the measured voltage $U_{M2}$ and knowledge of the resistance values $R_1$, $R_2$ of the voltage divider 14. The insulation resistance $R_{iso}$ is also determined from the two measured values $U_{M1}$, $U_{M2}$ and knowledge of the resistance values $R_1$, $R_2$ of the voltage divider 14. The voltage required for the measurement is provided in the form of the intermediate circuit voltage $U_{ZK}$ of the intermediate circuit 6. The necessary electrical energy is provided by a power supply 21, the DC input 3, or an energy storage device 18.

Previously, measurements of the system capacitance $C_{PV}$ and the insulation resistance $R_{iso}$ were provided at the start of the day when the photovoltaic modules 4 begin to generate a voltage. It is usually not necessary or not possible to make measurements during the night also. When the photovoltaic modules 4 are not generating any voltage, they are very highly resistive, which is why an exact measurement of the insulation resistance $R_{iso}$ would not be possible (see FIG. 2). Modern photovoltaic systems 1, in particular so-called hybrid systems with energy storage devices 18, make it necessary and practical to measure the system capacitance $C_{PV}$ and the insulation resistance $R_{iso}$ even during the night.

According to the invention, the measuring device 13 is designed to actuate an input short-circuit switch $S_{Boost}$ for short-circuiting the DC input 3 when the AC disconnector 8 is open, which allows the intermediate circuit voltage $U_{ZK}$ to be applied to the DC input 3 in the reverse direction. The circuit is therefore closed between the intermediate circuit 6 and the photovoltaic modules 4 in such a way that the current I (dashed arrow) flows in the forward direction of the bypass diodes $D_{Bypass}$ of the photovoltaic modules 4. This means that the system capacitance $C_{PV}$ and the insulation resistance $R_{iso}$ can also be reliably measured during the night when the photovoltaic modules 4 are particularly highly resistive. With the aid of the voltage measuring unit 15, a measured voltage $U_{M1}$, $U_{M2}$ is measured with the switch $S_{iso}$ open and closed respectively, and the system capacitance $C_{PV}$ and the insulation resistance $R_{iso}$ are determined from these measurements. The input short-circuit switch $S_{Boost}$ can ideally be formed by a boost switch $S_{Boost}$ of a DC/DC converter 5 implemented as a booster, which means that no dedicated hardware is required. The circuit and method are also suitable for photovoltaic modules 4 with integrated electronics 22 (see FIGS. 3 and 4), so-called MLPE (Module-Level Power Electronics), in which a reliable measurement of the system capacitance $C_{PV}$ or the insulation resistance $R_{iso}$ has not been possible up to now for certain circuits of the electronics 22. In addition, the system capacitance $C_{PV}$ or the insulation resistance $R_{iso}$ can be measured particularly accurately while taking into account any connected energy storage devices 18. It is only necessary to ensure that during the measurement of the measured voltages Um', $U_{M2}$ the energy storage device 18 is connected by closing the battery disconnector 17, so that a ground fault in the energy storage device 18 is also appropriately taken into account. Ideally, the system capacitance $C_{PV}$ and the insulation resistance $R_{iso}$ are measured both with the energy storage device 18 connected and with the energy storage device 18 disconnected. This allows the contribution of the energy storage device 18 to the system capacitance $C_{PV}$ and to the insulation resistance $R_{iso}$ to be measured separately and a fault in the photovoltaic system 1 to be better isolated or located more quickly.

If applicable, the measuring device 13 can be designed to measure the voltage $U_{DC}$ at the DC input 3 and if the measured voltage $U_{DC}$ is below a specified limit value $U_{DC\_limit}$ the input short-circuit switch $S_{Boost}$ can be actuated or closed when determining the system capacitance $C_{PV}$ and, if applicable, the insulation resistance $R_{iso}$. This ensures that during the night, when either no voltage or too low a voltage $U_{DC}$ is supplied by the photovoltaic modules 4, an exact determination of the measured values is possible.

For the sake of completeness, it should be noted that a photovoltaic inverter 2 can also have multiple DC inputs 3 for the connection of multiple strings 4' of photovoltaic modules 4. The described method for determining the system capacitance $C_{PV}$ and the insulation resistance $R_{iso}$ can then be performed at each DC input 3. The connection to the supply grid 10 or to the consumers 11 is then only made for those strings 4' of photovoltaic modules 4 for which the system capacitance $C_{PV}$ is below the defined maximum system capacitance $C_{PV\_max}$, or the AC disconnector 8 of the photovoltaic inverter 2 is only closed if the condition applies to all photovoltaic modules 4 and all components of the photovoltaic system 1. As a further condition for the closure of the AC disconnector 8, it is possible to check whether a defined minimum system capacitance $C_{PV\_min}$ is exceeded, which indicates a closed DC disconnector at the DC input 3 of the photovoltaic inverter 2 (not shown).

FIG. 2 shows a simplified circuit diagram of a photovoltaic inverter 2 according to the invention with photovoltaic modules 4 connected thereto, with the system capacitance $C_{PV}$ and the insulation resistance $R_{iso}$ to ground PE in parallel with it shown symbolically. The photovoltaic modules 4 are shown in the equivalent circuit diagram as current sources with a parallel parasitic diode $D_P$ in the flow direction, parallel resistor $R_P$ and series resistor $R_S$. If the cell of the photovoltaic module 4 is supplying current and a voltage $U_{DC}$ is present at the DC input 3 and if the voltage on the parasitic diode does not exceed the forward voltage $D_P$, only the relatively small series resistance $R_S$ (usually in the mOhm range) is active. During the night, however, the cell of the photovoltaic module 4 does not supply any current, and so the relatively high parallel resistance $R_P$ (usually a few kOhm) comes into effect. In conventional measuring methods, this high parallel resistor $R_P$ would distort the determination of the system capacitance $C_{PV}$ and the insulation resistance $R_{iso}$ or render them impossible.

The photovoltaic modules 4 are each bridged by a bypass diode $D_{Bypass}$, which is connected antiparallel to the flow direction of the solar current. The bypass diode $D_{Bypass}$ acts as a safety device in the photovoltaic module 4, through which the current is diverted via the bypass diode $D_{Bypass}$ in the event of shading or a defect in the photovoltaic module 4. The bypass diode $D_{Bypass}$ is usually located externally on the photovoltaic module 4. An equivalent circuit diagram of a single cell of the photovoltaic module 4 is shown. A string 4' of multiple photovoltaic modules 4 is connected to the DC input 3 of the photovoltaic inverter 2. The following DC/DC converter 5 is designed as a booster and contains a boost switch $S_{Boost}$ arranged in parallel with the DC input 3, which is normally used to regulate the maximum input DC voltage $U_{DC}$, and a boost diode $D_{Boost}$ in the direction of the desired current flow. The intermediate circuit 6 of the photovoltaic inverter 2 is represented by the intermediate circuit capacitor $C_{ZK}$, to which the intermediate circuit voltage $U_{ZK}$ is applied. The measuring device 13 for determining the system capacitance $C_{PV}$ and the insulation resistance $R_{iso}$ includes the voltage divider 14, which has at least two resistors $R_1$, $R_2$, wherein the resistor $R_1$ can be switched in or out via a switch $S_{iso}$. A voltage measuring unit 15 for recording measured voltages $U_{Mi}$ across resistor $R_2$ is arranged between the resistors $R_1$, $R_2$ at the centre of the voltage divider 14. According to the invention, the DC input 3 is short-circuited with an input short-circuit switch $S_{Boost}$ which is formed here by the boost switch $S_{Boost}$ of the DC/DC converter 5. This forms a circuit through the system capacitance $C_{PV}$ and the insulation resistance $R_{iso}$, according to which the intermediate circuit voltage $U_{ZK}$ is applied in the reverse direction to the photovoltaic modules 4 or the string 4' of the photovoltaic modules 4 (shown by dashed lines). The current I thus flows according to the dashed lines in the forward direction of the bypass diodes $D_{Bypass}$ This means that the system capacitance $C_{PV}$ and the insulation resistance $R_{iso}$ can also be reliably measured during the night when the photovoltaic modules 4 are particularly highly resistive. With the input short-circuit switch $S_{Boost}$ closed, a measured voltage $U_{M1}$ is recorded with the switch $S_{iso}$ of the voltage divider 14 open and a measured voltage $U_{M2}$ with the switch $S_{iso}$ of the voltage divider 14 closed. The system capacitance $C_{PV}$ and the insulation resistance $R_{iso}$ can be determined from the measured values of the two measured voltages $U_{M1}$, $U_{M2}$ or the temporal waveform.

FIG. 3 shows a simplified circuit diagram of a photovoltaic inverter 2 designed according to the invention with photovoltaic modules 4 connected thereto, having integrated electronics 22, so-called MLPE (Module-Level Power Electronics). The equivalent circuit diagram of the electronics 22 contains a switch $S_E$ in addition to the diode $D_E$ and a high-resistance measuring resistor $R_M$, via which the respective photovoltaic modules 4 can be deactivated. For safety reasons, for example, the photovoltaic modules 4 can be deactivated by opening the switch $S_E$ to ensure that no dangerous DC voltages are present on the supply lines to the photovoltaic inverter 2. In this case, the system capacitance $C_{PV}$ and, if applicable, the insulation resistance $R_{iso}$ could not be determined, or not reliably, with conventional methods because the current for measuring the system capacitance $C_{PV}$ and the insulation resistance $R_{iso}$ cannot flow through the string 4' of photovoltaic modules 4 due to the open switch $S_E$ in the electronics 22. Due to the short-circuiting of the DC input 3 according to the invention by means of the input short-circuit switch $S_{Boost}$ and the resulting reversal of the intermediate circuit voltage $U_{ZK}$ at DC input 3, a current flow is possible here via the diodes $D_E$ integrated in the electronics 22. This means that the system capacitance $C_{PV}$ and the insulation resistance $R_{iso}$ can even be reliably measured when the photovoltaic modules 4 are deactivated, or during the night when they are very highly resistive.

FIG. 4 shows a simplified circuit diagram of a photovoltaic inverter 3 designed according to the invention with photovoltaic modules 4 connected thereto having integrated electronics 22 and a connected energy storage device 18 with integrated battery disconnector 17. For the remainder, the description of the photovoltaic inverter 2 according to FIGS. 1 and 3 applies. In this case, before recording the measured voltages Um, it is additionally ensured that the battery disconnector 17 is closed, so that the energy storage device 18 is also taken into account in the measurement of the system capacitance $C_{PV}$ and the insulation resistance $R_{iso}$. The portion of the system capacitance $C_{PV,i}$ and the insulation resistance $R_{iso,i}$ from the energy storage device 18 relative to ground PE is symbolically indicated. The system capacitance $C_{PV}$ and, if applicable, the insulation resistance $R_{iso}$ are each determined with and without the energy storage device 18 connected. In this way, the contribution of the energy storage device 18 to the system capacitance $C_{PV}$ and insulation resistance $R_{iso}$ can be determined separately and any insulation faults can be located more quickly.

FIG. 5 shows a more detailed flowchart of the determination of the relative system capacitance $C_{PV}$ and the relative insulation resistance $R_{iso}$. After the method is started according to block 101, an initialization (block 102) takes place, during which phase the input short-circuit switch $S_{Boost}$ is also closed. The block 200, which is enclosed in dashed lines, contains the method steps for determining the relative system capacitance $C_{PV}$ and the relative insulation resistance $R_{iso}$, i.e. the test to determine whether the system capacitance $C_{PV}$ is below the defined maximum system capacitance $C_{PV\_max}$ and whether the insulation resistance $R_{iso}$ is above the defined minimum insulation resistance $R_{iso\_min}$. According to method step 202, the first measured voltage $U_{M1}$ is measured with the switch $S_{iso}$ of the voltage divider 14 open. After this, the switch $S_{iso}$ is closed according to step 203. Then (step 205), the second measured voltage $U_{M2}$ is measured with the switch $S_{iso}$ of the voltage divider 14 closed. After this, the insulation resistance $R_{iso}$ is determined according to step 206 and then according to step 207 it is ascertained whether the resistance is above the defined minimum insulation resistance $R_2$ From the temporal waveform of the measured voltage $U_{M2}$ with the switch $S_{iso}$ closed, the system capacitance $C_{PV}$ is determined (step 208) and it is ascertained whether this is below the defined maximum system capacitance $C_{PV\_max}$ (block 209). If both the insulation resistance $R_{iso}$ and the system capacitance $C_{PV}$ do not exceed or fall below the corresponding limit values, according to block 301 the switch $S_{iso}$ of the voltage divider 14 and the input short-circuit switch $S_{Boost}$ are opened and then the photovoltaic inverter 2 is connected to the supply grid 10 and or the consumers 11 by closing the AC disconnector 8 (block 302).

If the insulation resistance $R_{iso}$ is lower than the defined minimum insulation resistance $R_{iso\_min}$, i.e. the query 207 returns a negative result, then according to method step 303 the procedure waits for a defined time and after a certain length of time (block 306) the measurement is restarted and processing jumps to method step 101. After a certain number of measurements or a certain time has been exceeded, an error message is issued according to block 304 and the switch $S_{iso}$ of the voltage divider and the input short-circuit switch $S_{Boost}$ are opened. Therefore, no sufficiently high insulation resistance $R_{iso}$ is measured. If the system capacitance $C_{PV}$ exceeds the defined maximum system capacitance $C_{PV\_max}$, i.e. if the query 209 returns a negative result, an error message is output and the switch $S_{iso}$ of the voltage divider 14 is opened (block 305) and after a specified time period (block 306) processing returns to the start (block 101).

FIG. 6 shows the flowchart according to FIG. 5 for a hybrid inverter with a connected energy storage device 18. For the sake of simplicity the method steps within block 200 are not shown in as much detail here as they are in FIG. 5. In addition to the method steps described in FIG. 5 with the energy storage device 18 connected, i.e. with the battery disconnector 17 closed, after determining the relative system capacitance $C_{PV}$, i.e. whether the capacitance is below the defined maximum system capacitance $C_{PV\_max}$ (block 207), and the relative insulation resistance $R_{iso}$, i.e. whether the resistance exceeds the defined minimum insulation resistance $R_{iso\_min}$ (block 209), the energy storage device 18 is disconnected by opening the battery disconnector 17 and the switch $S_{iso}$ of the voltage divider 14 is opened (block 401). If a fault occurs when the battery disconnector 17 is opened, an error message is issued according to block 402. Otherwise, the insulation resistance $R_{iso}$ (block 403) and the system capacitance $C_{PV}$ (block 406) are determined and compared with the defined minimum insulation resistance $R_{iso\_min}$ (block 405) and the defined maximum system capacitance $C_{PV\_max}$ (block 406). If the queries 405 and 406 return a positive result, according to block 407 the switch $S_{iso}$ of the voltage divider 14 and the input short-circuit switch $S_{Boost}$ are opened followed by the connection of the photovoltaic inverter 2 without a connected energy storage device 18 to the supply network 10 or the consumers 11 by closing the AC disconnector 8 (block 408). If one of the queries 405 and 406 returns a negative result an error message is issued according to block 304 or 305 and after waiting for a specified time (block 306) the method for determining the relative system capacitance $C_{PV}$ and, if applicable, the insulation resistance $R_{iso}$, is restarted.

FIG. 7 shows a more detailed flowchart of the determination of the absolute system capacitance $C_{PV}$ and the absolute insulation resistance $R_{iso}$. The initialization according to block 102 is shown in more detail in this case. Accordingly, according to block 104, the voltage $U_{DC}$ at DC input 3 of the photovoltaic inverter 2 is measured and compared with a specified limit value $U_{DC\_limit}$ (block 104). If the comparison returns a positive result, this is an indication that the photovoltaic module 4 is not supplying voltage (e.g. it is night-time or the switch $S_E$ of the electronics 22 of the photovoltaic module 4 is open) and the DC input 3 is short-circuited with the input short-circuit switch $S_{Boost}$ (block 105). Otherwise, the input short-circuit switch $S_{Boost}$ remains open (block 106) and the absolute system capacitance $C_{PV}$ and the absolute insulation resistance $R_{iso}$ are determined without a short-circuited DC input 3.

In addition to the method steps according to FIG. 5, the measurements of the first measured voltage $U_{M1}$ with the switch $S_{iso}$ of the voltage divider 14 open and of the second measured voltage $U_{M2}$ with the switch $S_{iso}$ of the voltage divider 14 closed are carried out here for a specified time interval $\Delta t$, in particular 1 s to 10 s, so that transient processes can decay and stable readings are obtained (blocks 201 and 204). Otherwise, the determination of the system capacitance $C_{PV}$ and the insulation resistance $R_{iso}$ proceeds as shown and described in FIG. 5.

Finally, FIG. 8 shows a flowchart according to FIG. 7 for a hybrid inverter with a connected energy storage device 18. During initialization (block 102), the energy storage device 18 is connected to the photovoltaic inverter 2 (block 103) by closing the battery disconnector 17. After that, the initialization corresponds to that shown in FIG. 7. For the sake of clarity the waiting times described in FIG. 7 (blocks 201 and 205) for the measurement of the absolute system capacitance $C_{PV}$ and the absolute insulation resistance $R_{iso}$ are not shown here, and block 200 is grouped together. If the measurement with energy storage device 18 connected returns a positive result, the photovoltaic inverter 2 is connected to the supply network 10 or the consumers 11 with the energy storage device 18 connected (block 302), otherwise the measurement is repeated with the energy storage device 18 disconnected (blocks 401 to 406). If this measurement returns a positive result, the photovoltaic inverter 2 is connected to the supply network 10 or the consumers 11 with the energy storage device 18 disconnected (block 408). If this measurement also returns a negative result, the photovoltaic inverter 2 is not connected to the supply network 10 or the consumers 11 and the measurement is restarted at method step 101 after a specified time has elapsed (block 306).

The present invention enables a simple and reliable determination of the system capacitance $C_{PV}$ and, if applicable, the insulation resistance $R_{iso}$ of a photovoltaic system 1 relative to ground PE, in particular also during the night or when the photovoltaic modules 4 are deactivated, taking into account any energy storage devices 18 that are connected to the photovoltaic inverter 2.

The invention claimed is:

1. A method for determining the system capacitance ($C_{PV}$) of a photovoltaic system (1) relative to ground (PE), having a photovoltaic inverter (2) with at least one DC input (3) for connecting to at least one photovoltaic module (4) or a string (4') of a plurality of photovoltaic modules (4), a DC/DC converter (5) with an input diode ($D_{Boost}$), an intermediate circuit (6), a DC/AC converter (7), an AC disconnector (8), an AC output (9) for connection to a supply network (10) and/or consumer (11), a control device (12), and with a measuring device (13) with a voltage divider (14) containing at least two resistors ($R_1$, $R_2$), a switch ($S_{iso}$) for connecting a resistor ($R_1$) of the voltage divider (14) and a voltage measuring unit (15) for recording measured voltages ($U_{Mi}$) on at least one resistor ($R_2$) of the voltage divider (14) with the switch ($S_{iso}$) of the voltage divider (14) open and closed, and for determining the system capacitance ($C_{PV}$) from the temporal waveform of the recorded measured voltages ($U_{Mi}$), the method comprising the steps of:
   providing the voltage required for the measurement by the intermediate circuit (6) in the form of the intermediate circuit voltage ($U_{ZK}$),
   recording measured voltages ($U_{Mi}$) with the AC disconnector (8) open while short-circuiting the DC input (3) with an input short-circuit switch ($S_{Boost}$), which applies the intermediate circuit voltage ($U_{ZK}$) to the DC input (3) in the reverse direction, and
   determining the system capacitance ($C_{PV}$) from the temporal waveform of the measured voltage ($U_{M2}$) after the switch ($S_{iso}$) of the voltage divider (14) is closed.

2. The method according to claim 1, further comprising the step of only closing the AC disconnector (8) if a defined maximum system capacitance ($C_{PV\_max}$) is not exceeded.

3. The method according to claim 1, further comprising the stops of measuring the voltage ($U_{DC}$) at the DC input (3) of the photovoltaic inverter (2), and if the voltage ($U_{DC}$) is below a preset limit value ($U_{DC\_limit}$), short-circuiting the DC input (3) with the input short-circuit switch ($S_{Boost}$).

4. The method according to claim 1, further comprising the step of determining the insulation resistance ($R_{iso}$) of the photovoltaic system (1) relative to ground (PE) from the measured values of the two measured voltages ($U_{M1}$, $U_{M2}$) recorded with the switch ($S_{iso}$) of the voltage divider (14) open and closed.

5. The method according to claim 1, further comprising the steps of connecting an energy storage device (18) by closing a battery disconnector (17), recording the measured voltages ($U_{M1}$, $U_{M2}$) and using the measured voltages ($U_{M1}$, $U_{M2}$) to determine the system capacitance ($C_{PV}$) and, if applicable, the insulation resistance ($R_{iso}$).

6. The method according to claim 5, further comprising the step of determining each of the falling below of the defined maximum system capacitance ($C_{PV\_max}$), the absolute system capacitance ($C_{PV}$), the exceeding of the defined minimum insulation resistance ($R_{iso\_min}$), and/or the absolute insulation resistance ($R_{iso}$) with and without the energy storage device (18) connected.

7. The method according to claim 1, further comprising the step of averaging the measured voltages ($U_{M1}$, $U_{M2}$) over a defined period of time ($\Delta t_m$).

8. The method according to claim 1, further comprising the step of displaying and/or storing the falling below of the defined maximum system capacitance ($C_{PV\_max}$), the absolute system capacitance ($C_{PV}$), the exceeding of the defined minimum insulation resistance ($R_{iso\_min}$), and/or the absolute insulation resistance ($R_{iso}$).

9. The method according to claim 1, further comprising the step of determining the falling below of the defined maximum system capacitance ($C_{PV\_max}$), the absolute system capacitance ($C_{PV}$), the exceeding of the defined minimum insulation resistance ($R_{iso\_min}$), and/or the absolute insulation resistance ($R_{iso}$) within a measuring time ($t_m$) of a maximum of 10 s.

10. A photovoltaic inverter (2) for determining the system capacitance (CPV) of a photovoltaic system (1) relative to ground (PE), the photovoltaic inverter comprising:
at least one DC input (3) for connecting to at least one photovoltaic module (4) or a string (4') of a plurality of photovoltaic modules (4),
a DC/DC converter (5) with an input diode ($D_{Boost}$),
an intermediate circuit (6),
a DC/AC converter (7),
an AC disconnector (8),
an AC output (9) for connection to a supply network (10) and/or consumer (11),
a control device (12), and
a measuring device (13) with a voltage divider (14), the measuring device comprising at least two resistors ($R_1$, $R_2$), a switch ($S_{iso}$) for connecting a resistor ($R_1$) of the voltage divider (14), and a voltage measuring unit (15) for recording measured voltages ($U_{Mi}$) on at least one resistor ($R_2$) of the voltage divider (14) with the switch ($S_{iso}$) of the voltage divider (14) open and closed, and for determining the system capacitance ($C_{PV}$) from the temporal waveform of the recorded measured voltages ($U_{Mi}$),
wherein the voltage required for the measurement is provided by the intermediate circuit (6) in the form of the intermediate circuit voltage ($U_{ZK}$), and the measuring device (13) actuates an input short-circuit switch ($S_{Boost}$) for short-circuiting the DC input (3) with the AC disconnector (8) open, as a result of which the intermediate circuit voltage ($U_{ZK}$) is applied to the DC input (3) in the reverse direction, and the measuring device (13) determines the system capacitance ($C_{PV}$) from the temporal waveform of the measured voltage ($U_{M2}$) after the switch ($S_{iso}$) of the voltage divider (14) is closed.

11. The photovoltaic inverter (2) according to claim 10, wherein the measuring device (13) is connected to the AC disconnector (8) or the control device (12) so that the AC disconnector (8) is closed only if a defined maximum system capacitance ($C_{PV\_max}$) is not exceeded.

12. The photovoltaic inverter (2) according to claim 10, further comprising at least one battery terminal (16) with at least one battery disconnector (17) connected to the intermediate circuit (6) for connection to at least one energy storage device (18), wherein the battery disconnector (17) is connected to the measuring device (13) or the control device (12) so that the battery disconnector (17) is actuated during the recording of the measured voltages ($U_{M1}$, $U_{M2}$).

13. The photovoltaic inverter (2) according to claim 10, wherein the input short-circuit switch ($S_{Boost}$) comprises by an existing boost switch ($S_{Boost}$) of the DC/DC converter (5) implemented as a booster.

14. The photovoltaic inverter (2) according to claim 10, wherein the measuring device (13) determines the insulation resistance ($R_{iso}$) from the measured voltages ($U_{M1}$, $U_{M2}$) with the switch ($S_{iso}$) of the voltage divider (14) open and closed.

15. The photovoltaic inverter (2) according to claim 10, further comprising a display (19) and/or a memory (20) for respectively displaying and storing the falling below of the defined maximum system capacitance ($C_{PV\_max}$), the absolute system capacitance ($C_{PV}$), the exceeding of the defined minimum insulation resistance ($R_{iso\_min}$), and/or the absolute insulation resistance ($R_{iso}$).

* * * * *